(12) United States Patent
Chen

(10) Patent No.: US 11,792,912 B2
(45) Date of Patent: Oct. 17, 2023

(54) HEAT DISSIPATION STRUCTURE WITH STACKED THERMAL INTERFACE MATERIALS

(71) Applicant: Wistron NeWeb Corporation, Hsinchu (TW)

(72) Inventor: Bo-Yen Chen, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 128 days.

(21) Appl. No.: 17/673,950

(22) Filed: Feb. 17, 2022

(65) Prior Publication Data

US 2022/0408603 A1    Dec. 22, 2022

(30) Foreign Application Priority Data

Jun. 22, 2021  (TW) .................................. 110122834

(51) Int. Cl.
*H05K 1/02*      (2006.01)
*H05K 7/20*      (2006.01)
*F28D 15/02*     (2006.01)

(52) U.S. Cl.
CPC ......... *H05K 1/021* (2013.01); *H05K 7/20454* (2013.01); *F28D 15/02* (2013.01); *H05K 7/20336* (2013.01); *H05K 7/20472* (2013.01); *H05K 2201/066* (2013.01)

(58) Field of Classification Search
CPC .... H05K 7/20; H05K 7/2029; H05K 7/20336; H05K 7/2039; H05K 7/20436; H05K 7/20454; H05K 7/20472–20481; H05K 7/205; H05K 7/20509; H05K 1/0203; H05K 2201/066; H05K 1/021; H05K 3/0061; H01L 23/34; H01L 23/36;
(Continued)

(56) References Cited

U.S. PATENT DOCUMENTS 10,916,861 B2 *   2/2021  Yoon ..................... H01Q 1/2283
2014/0378072 A1 * 12/2014  Waldvogel ............... H05K 3/30
                                                       361/720
(Continued)

FOREIGN PATENT DOCUMENTS

CN    202841805 U  *  3/2013
CN    202841805 U     3/2013
TW    I731622 B       6/2021

*Primary Examiner* — Zachary Pape
*Assistant Examiner* — Steven Ngo
(74) *Attorney, Agent, or Firm* — McClure, Qualey & Rodack, LLP

(57) ABSTRACT

A heat dissipation structure includes a heat sink, a first thermal interface material, a second thermal interface material, a circuit board and a circuit element. The first thermal interface material is connected to the heat sink and has fluidity. The second thermal interface material is connected to the first thermal interface material and has no fluidity. The circuit board is connected to the second thermal interface material and has an opening, a top board surface and a bottom board surface. The circuit element includes a convex portion and a base portion. The convex portion has a top convex surface and is disposed in the opening. The base portion is connected to the convex portion and the bottom board surface. The second thermal interface material is connected to the top board surface and the top convex surface.

10 Claims, 8 Drawing Sheets

(58) Field of Classification Search
CPC ....... H01L 23/373–3738; H01L 23/427; G06F 1/20–203; F28D 15/02
See application file for complete search history.

(56) References Cited

U.S. PATENT DOCUMENTS

| | | | |
|---|---|---|---|
| 2015/0243609 A1* | 8/2015 | Lamorey | H01L 25/165 361/717 |
| 2019/0254157 A1* | 8/2019 | Kotlar | H05K 7/205 |
| 2020/0329550 A1* | 10/2020 | Seo | H05K 1/021 |
| 2021/0298203 A1 | 9/2021 | Chung et al. | |

* cited by examiner

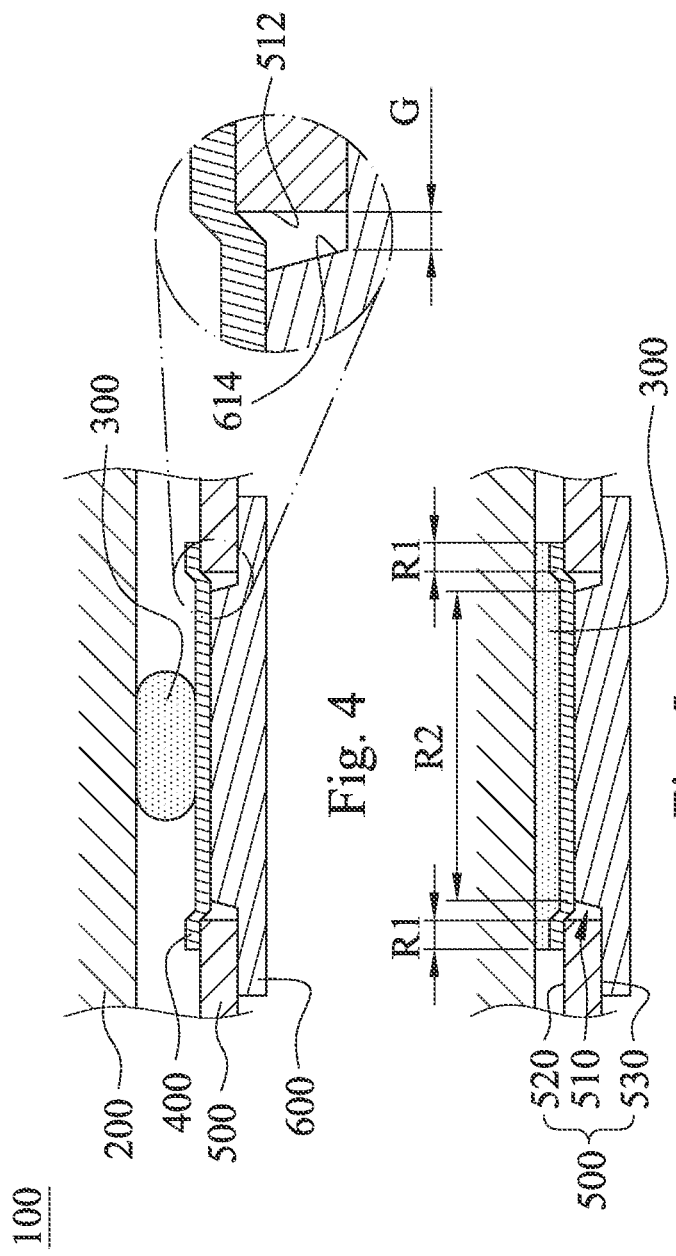

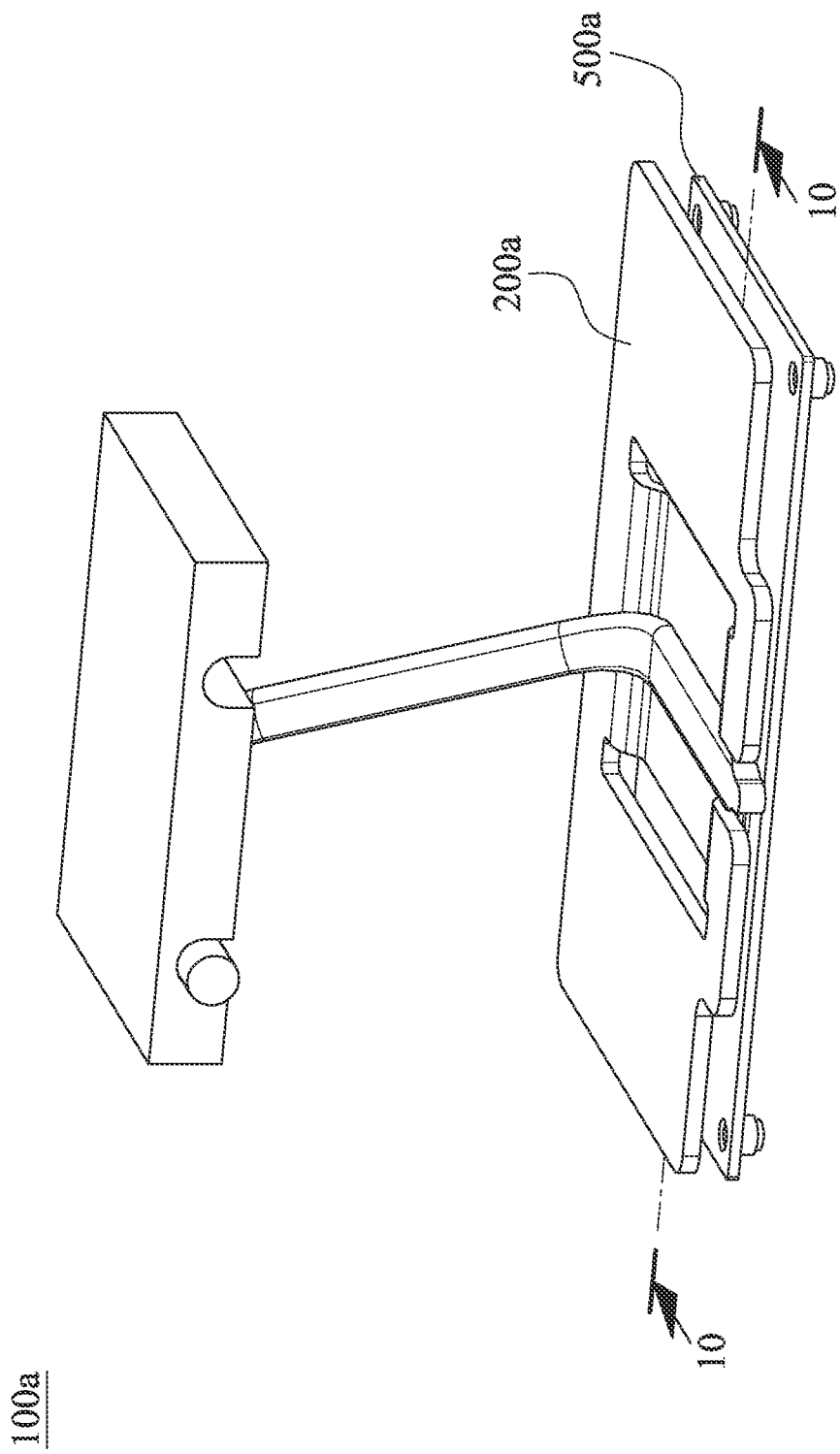

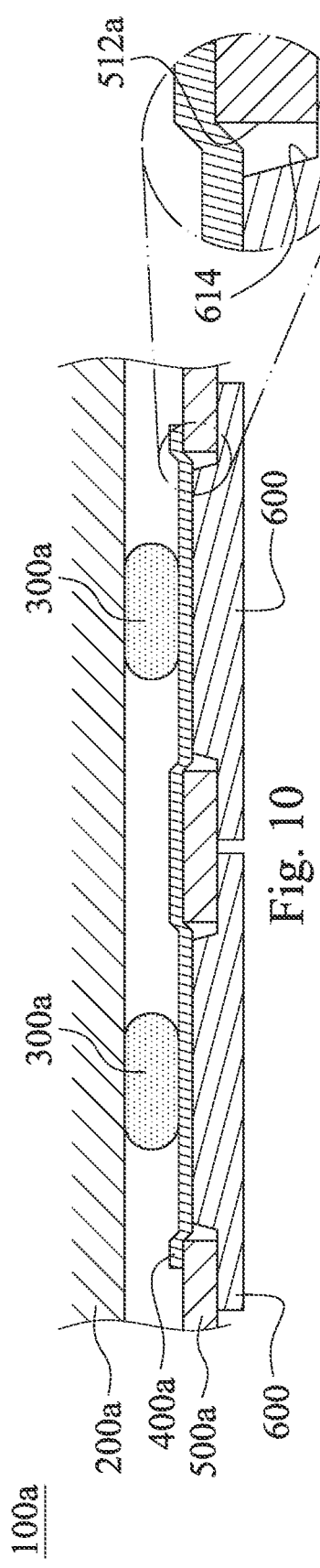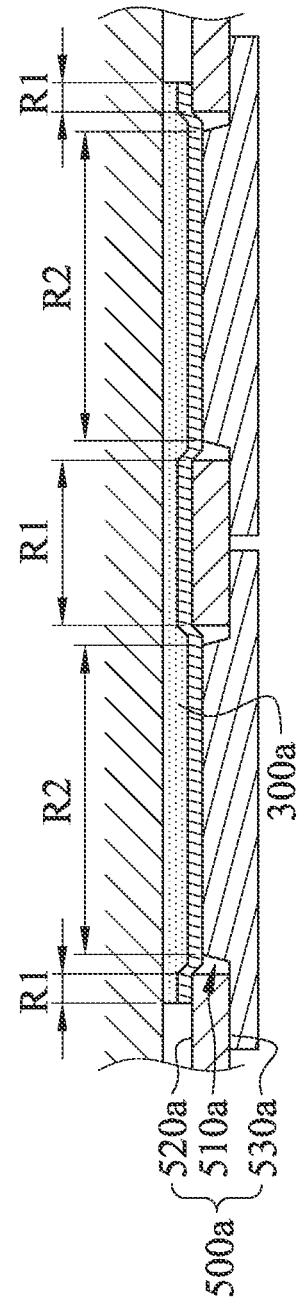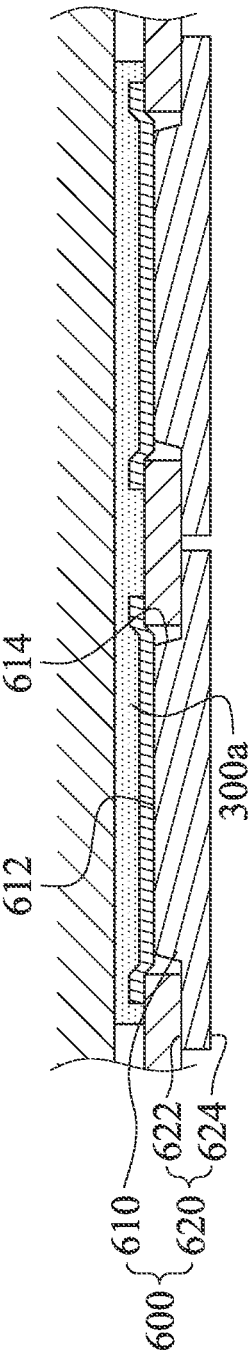

HEAT DISSIPATION STRUCTURE WITH STACKED THERMAL INTERFACE MATERIALS

RELATED APPLICATIONS

This application claims priority to Taiwan Application Serial Number 110122834, filed Jun. 22, 2021, which is herein incorporated by reference.

BACKGROUND

Technical Field

The present disclosure relates to a heat dissipation structure. More particularly, the present disclosure relates to a heat dissipation structure with multiple thermal interface materials.

Description of Related Art

As circuit elements become more and more advance, and the supporting measure of heat dissipation also need to be progressed. Most of the conventional heat dissipation structures are filled with a kind of thermal interface material (TIM) has abilities of heat conductive and compression deformation between a circuit element and a heat sink.

The conventional thermal interface material can be divided into two types. The first type of thermal interface material has fluidity. Therefore, the thermal interface material may overflow to another surface of the circuit element and affects an efficiency of the circuit. The second type of thermal interface material has a specific body and hardness, a force may generate while the second type of thermal interface material is compressed. The force will damage the circuit element or caused a ball grid array crack (BGA crack). Thus, developing a heat dissipation structure without affecting the circuit efficiency and avoiding the problems caused by an applying force is commercially desirable.

SUMMARY

According to one aspect of the present disclosure, a heat dissipation structure includes a heat sink, a first thermal interface material, a second thermal interface material, a circuit board and a circuit element. The first thermal interface material is connected to the heat sink and has fluidity. The second thermal interface material is connected to the first thermal interface material and has no fluidity. The circuit board is connected to the second thermal interface material and has an opening, a top board surface and a bottom board surface. The circuit element includes a convex portion and a base portion. The convex portion has a top convex surface and is disposed in the opening. The base portion is connected to the convex portion and the bottom board surface. The heat sink, the first thermal interface material, the second thermal interface material, the circuit board and the circuit element are connected in sequence, and the second thermal interface material is connected to the top board surface and the top convex surface.

According to another aspect of the present disclosure, a heat dissipation structure includes a heat sink, a first thermal interface material, a second thermal interface material, a circuit board and a plurality of circuit elements. The first thermal interface material is connected to the heat sink and has fluidity. The second thermal interface material is connected to the first thermal interface material and has no fluidity. The circuit board is connected to the second thermal interface material and has a plurality of openings, a top board surface and a bottom board surface. Each of the circuit elements includes a convex portion and a base portion. The convex portion has a top convex surface and is disposed in one of the openings. The base portion is connected to the convex portion and the bottom board surface. The heat sink, the first thermal interface material, the second thermal interface material, the circuit board and the circuit elements are connected in sequence, and the second thermal interface material is connected to the top board surface and the top convex surface of the convex portion of each of the circuit elements.

BRIEF DESCRIPTION OF THE DRAWINGS

The present disclosure can be more fully understood by reading the following detailed description of the embodiment, with reference made to the accompanying drawings as follows:

FIG. 4 shows a partial cross-sectional view of the heat dissipation structure taken along line 4-4 in FIG. 1 before a first thermal interface material is deformed.

FIG. 5 shows a partial cross-sectional view of a first example of the heat dissipation structure taken along line 4-4 in FIG. 1 after the first thermal interface material is deformed.

FIG. 6 shows a partial cross-sectional view of a second example of the heat dissipation structure taken along line 4-4 in FIG. 1 after the first thermal interface material is deformed.

FIG. 7 shows a three-dimensional schematic view of a heat dissipation structure according to a second embodiment of the present disclosure.

FIG. 10 shows a partial cross-sectional view of the heat dissipation structure taken along line 10-10 in FIG. 7 before a first thermal interface material is deformed.

FIG. 11 shows a partial cross-sectional view of a first example of the heat dissipation structure taken along line 10-10 in FIG. 7 after the first thermal interface material is deformed.

FIG. 12 shows a partial cross-sectional view of a second example of the heat dissipation structure taken along line 10-10 in FIG. 7 after the first thermal interface material is deformed.

DETAILED DESCRIPTION

The embodiment will be described with the drawings. For clarity, some practical details will be described below. However, it should be noted that the present disclosure should not be limited by the practical details, that is, in some embodiment, the practical details is unnecessary. In addition, for simplifying the drawings, some conventional structures and elements will be simply illustrated, and repeated elements may be represented by the same labels.

It will be understood that when an element (or device) is referred to as be "connected to" another element, it can be directly connected to the other element, or it can be indirectly connected to the other element, that is, intervening elements may be present. In contrast, when an element is referred to as be "directly connected to" another element, there are no intervening elements present. In addition, the terms first, second, third, etc. are used herein to describe various elements or components, these elements or components should not be limited by these terms. Consequently, a first element or component discussed below could be termed a second element or component.

Figure 1:
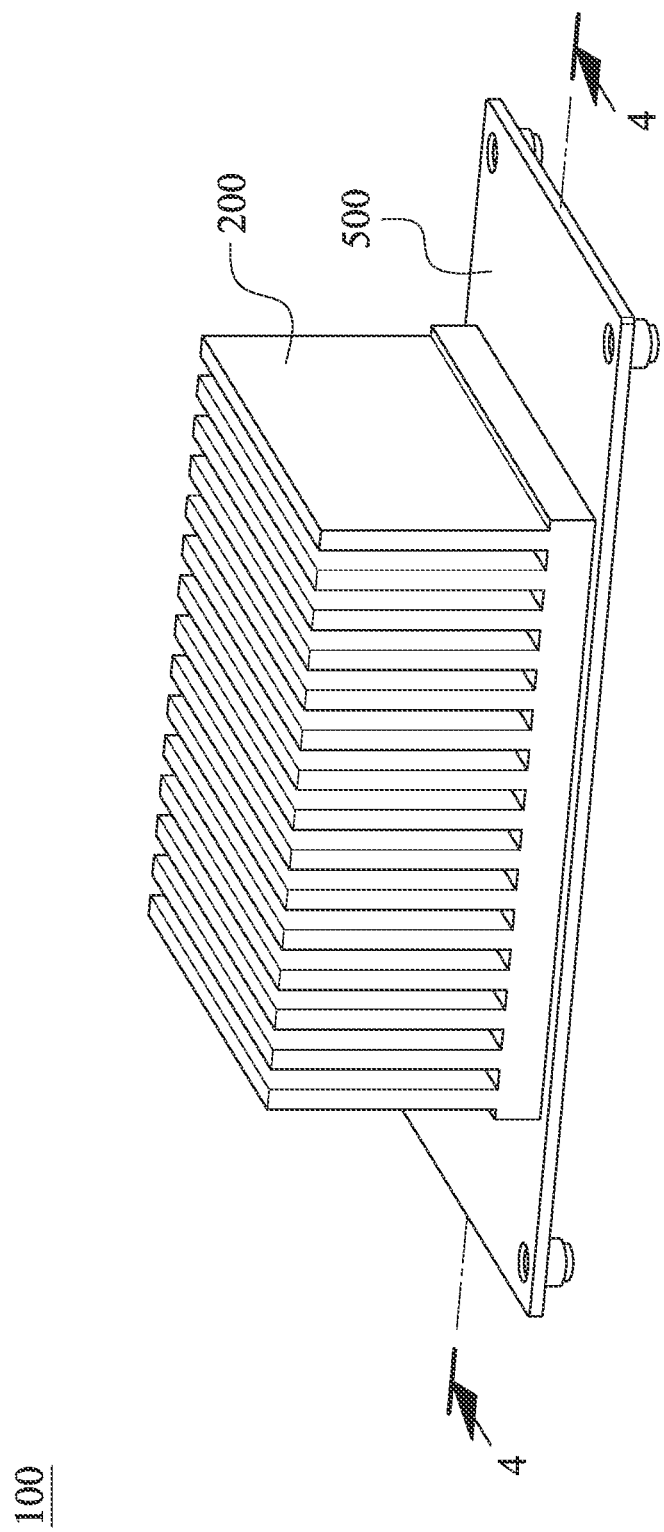
FIG. 1 shows a three-dimensional schematic view of a heat dissipation structure according to a first embodiment of the present disclosure.
Figure 2:
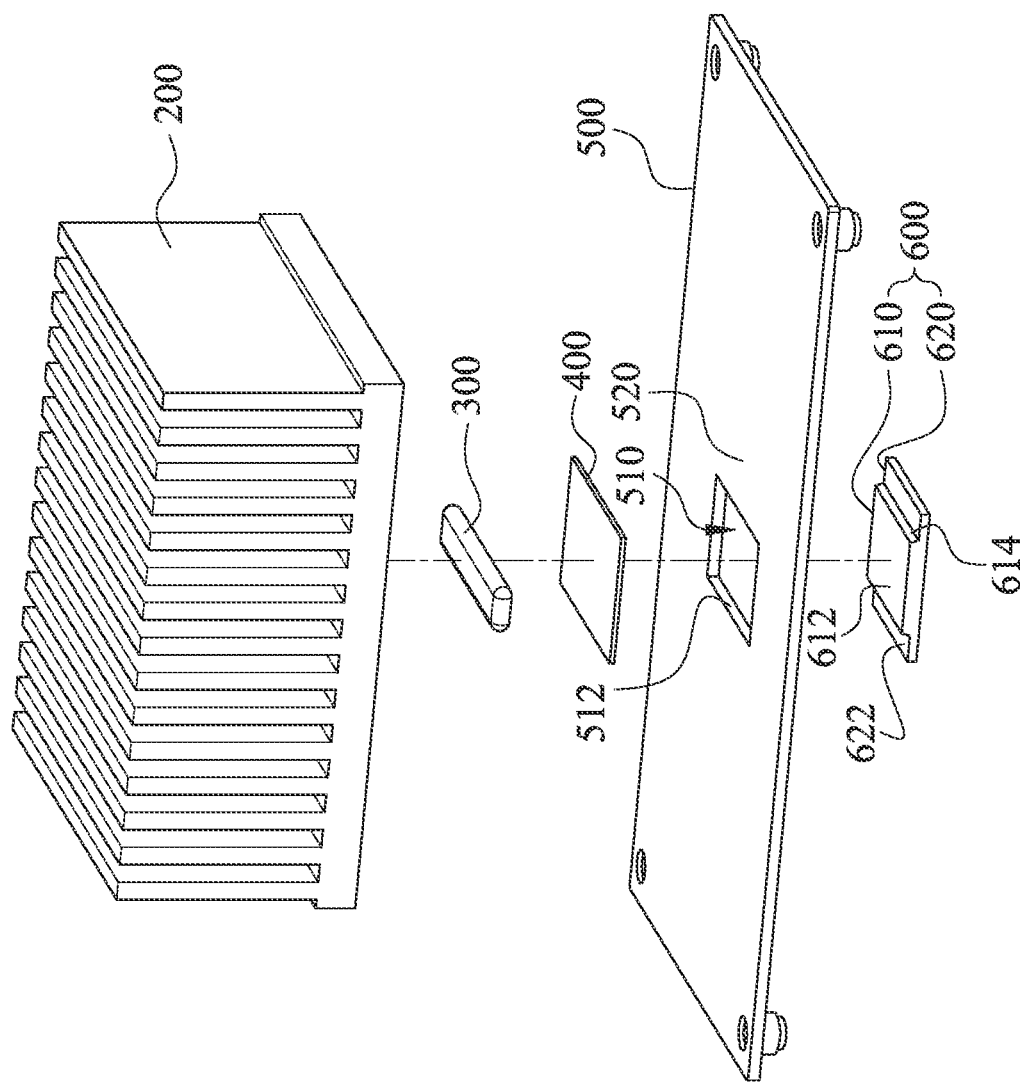
FIG. 2 shows a three-dimensional exploded view at a first viewing angle of the heat dissipation structure according to the embodiment of FIG. 1.
Figure 3:
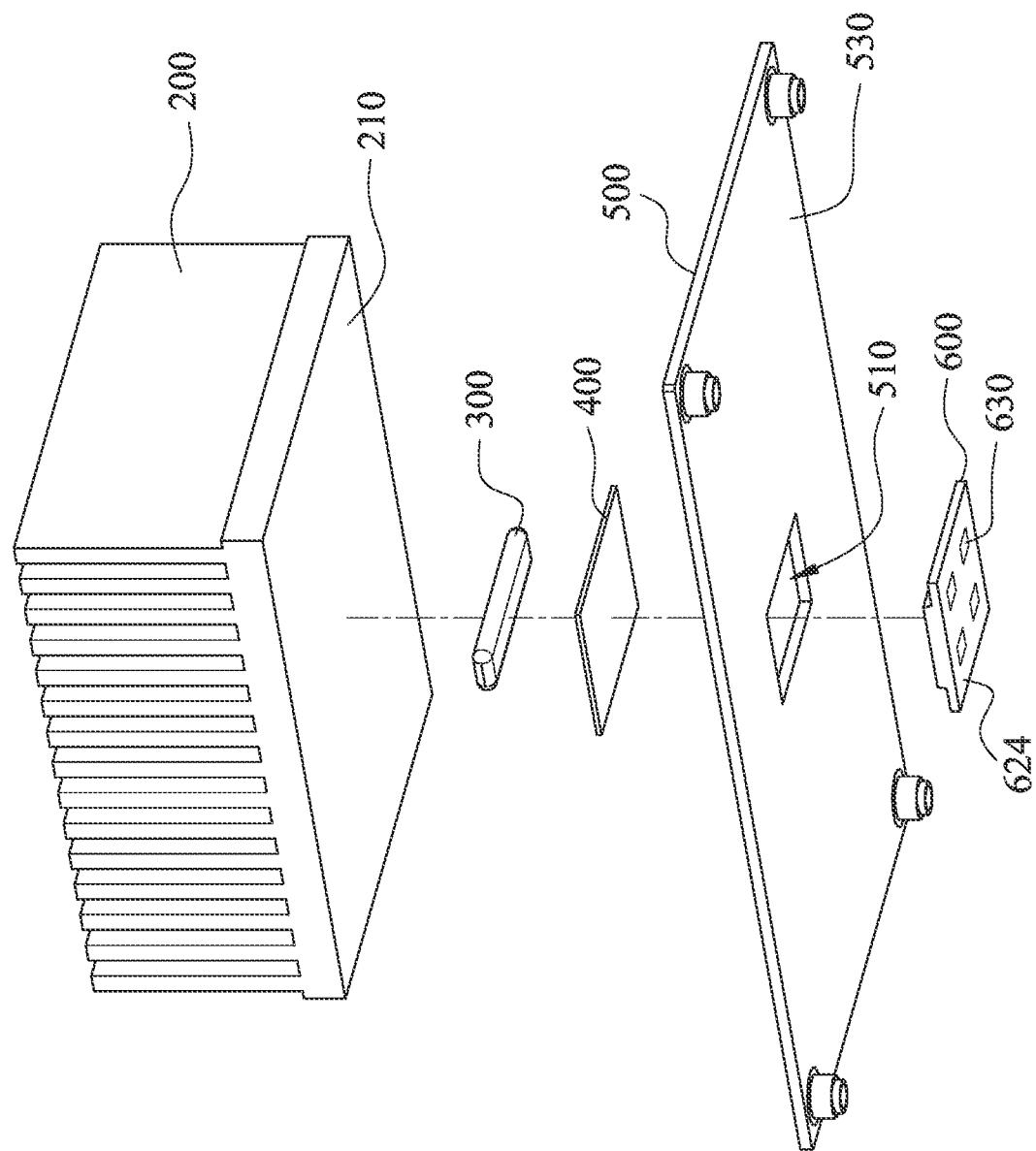
FIG. 3 shows a three-dimensional exploded view at a second viewing angle of the heat dissipation structure according to the embodiment of FIG. 1.

Please refer to FIG. 1 to FIG. 3. FIG. 1 shows a three-dimensional schematic view of a heat dissipation structure 100 according to a first embodiment of the present disclosure. FIG. 2 shows a three-dimensional exploded view at a first viewing angle of the heat dissipation structure 100 according to the embodiment of FIG. 1. FIG. 3 shows a three-dimensional exploded view at a second viewing angle of the heat dissipation structure 100 according to the embodiment of FIG. 1. The heat dissipation structure 100 includes a heat sink 200, a first thermal interface material 300, a second thermal interface material 400, a circuit board 500 and a circuit element 600.

The heat sink 200 is made of metal, and can be a cooling fin. The heat sink 200 includes a heat dissipation bottom surface 210, and the heat dissipation bottom surface 210 is connected to the first thermal interface material 300.

The first thermal interface material 300 is connected to the heat sink 200 and has fluidity. In detail, the first thermal interface material 300 has a flow rate, and can be a thermal jelly. The flow rate represents measuring a weight (gram) of the first thermal interface material 300 which can be squeezed out per minute under a particular test environment such as a taper tip with a volume of 75 ml (cc), an orifice of 0.125 inch and a squeezing pressure of 90 pounds per square inch (psi). In one embodiment, the flow rate is from 50 g/min to 110 g/min, the thermal conductivity is from 2.3 W/mk to 6.4 W/mk. The first thermal interface material 300 can absorb an assembly tolerance caused by stacking the mechanism (e.g., stacking the heat sink 200), and does not generate an applying force after compressed. Moreover, the first thermal interface material 300 is in a strip shape before compressed, and in a sheet shape after compressed.

The second thermal interface material 400 is connected to the first thermal interface material 300, and has no fluidity. In detail, the second thermal interface material 400 has hardness, and can be a thermal pad. In one embodiment of the present disclosure, a hardness of the second thermal interface material 400 is 30 Shore 00. A thermal conductivity of the second thermal interface material 400 is from 1 W/mk to 10 W/mk, and a thickness of the second thermal interface material 400 is from 0.5 mm to 3 mm. The second thermal interface material 400 can be cut to change a size according to the demand, and the second thermal interface material 400 has a specific body and can be deformed while compressed. The second thermal interface material 400 generates an applying force after deformed, and the applying force continues to act.

The circuit board 500 is connected to the second thermal interface material 400, and has an opening 510, a top board surface 520 and a bottom board surface 530. The circuit board 500 can be a printed circuit board (PCB).

The circuit element 600 includes a convex portion 610 and a base portion 620. The convex portion 610 has a top convex surface 612 and is disposed in the opening 510. The base portion 620 is connected to the convex portion 610 and the bottom board surface 530. In detail, the circuit element 600 can be an antenna module (such as millimeter wave antenna module), and the antenna module includes at least one antenna 630. The base portion 620 has a top surface 622 and a bottom surface 624. The top surface 622 and the bottom surface 624 are disposed on two opposite sides of the base portion 620, respectively. The top surface 622 faces toward the circuit board 500, and the at least one antenna 630 is disposed on the bottom surface 624. A number and a type of the antenna 630 can be decided as required.

The aforementioned heat sink 200, the first thermal interface material 300, the second thermal interface material 400, the circuit board 500 and the circuit element 600 are connected in sequence, and the second thermal interface material 400 is connected to the top board surface 520 and the top convex surface 612. An interface material area of the second thermal interface material 400 is greater than a hole area of the opening 510. The second thermal interface material 400 covers the opening 510 and a part of the top board surface 520 to seal the opening 510.

Please refer to FIG. 1 to FIG. 6. FIG. 4 shows a partial cross-sectional view of the heat dissipation structure 100 taken along line 4-4 in FIG. 1 before the first thermal interface material 300 is deformed. FIG. 5 shows a partial cross-sectional view of a first example of the heat dissipation structure 100 taken along line 4-4 in FIG. 1 after the first thermal interface material 300 is deformed. FIG. 6 shows a partial cross-sectional view of a second example of the heat dissipation structure 100 taken along line 4-4 in FIG. 1 after the first thermal interface material 300 is deformed. As shown in FIG. 4, the first thermal interface material 300 is in a strip shape before compressed and deformed. In FIG. 5, the first thermal interface material 300 is only connected between the heat sink 200 and the second thermal interface material 400. In FIG. 6, the first thermal interface material 300 is only connected between the heat sink 200, the second thermal interface material 400 and the circuit board 500. In other words, a part of the first thermal interface material 300 may flow over the second thermal interface material 400 to the top board surface 520 which is not covered by the second thermal interface material 400. Moreover, the heat sink 200, the first thermal interface material 300, the second thermal interface material 400, the circuit board 500 and the circuit element 600 are connected in sequence at an area position R1 which is corresponding to a position except for the opening 510. The heat sink 200, the first thermal interface material 300, the second thermal interface material 400 and the circuit element 600 are connected in sequence at an area position R2 corresponding to the opening 510. Furthermore, the top convex surface 612 is disposed in the opening 510, and a convex surface area of the top convex surface 612 is smaller than a hole area of the opening 510. An edge 512 of the opening 510 is spaced from a side edge 614 of the convex portion 610 by a gap G.

Thus, the heat dissipation structure 100 of the present disclosure can utilize a combination of multiple thermal interface materials, wherein the fluidity of the first thermal interface material 300 can reduce the applying force generated by compressing the second thermal interface material 400, to absorb assembly tolerance, and avoid too much force applying on the circuit element 600 and ball grid array (BGA) crack. Moreover, the second thermal interface material 400 has a specific shape and hardness to prevent the first thermal interface material 300 from overflowing to the circuit element 600 due to compression. The dissipation structure 100 of the present disclosure utilizes the two different thermal interface materials to achieve mutual benefit complementation, and solve the problems of the assembly tolerance, the circuit efficiency affected by the overflowing of the thermal interface material and destruction caused by the applying force in the conventional technique.

Figure 8:
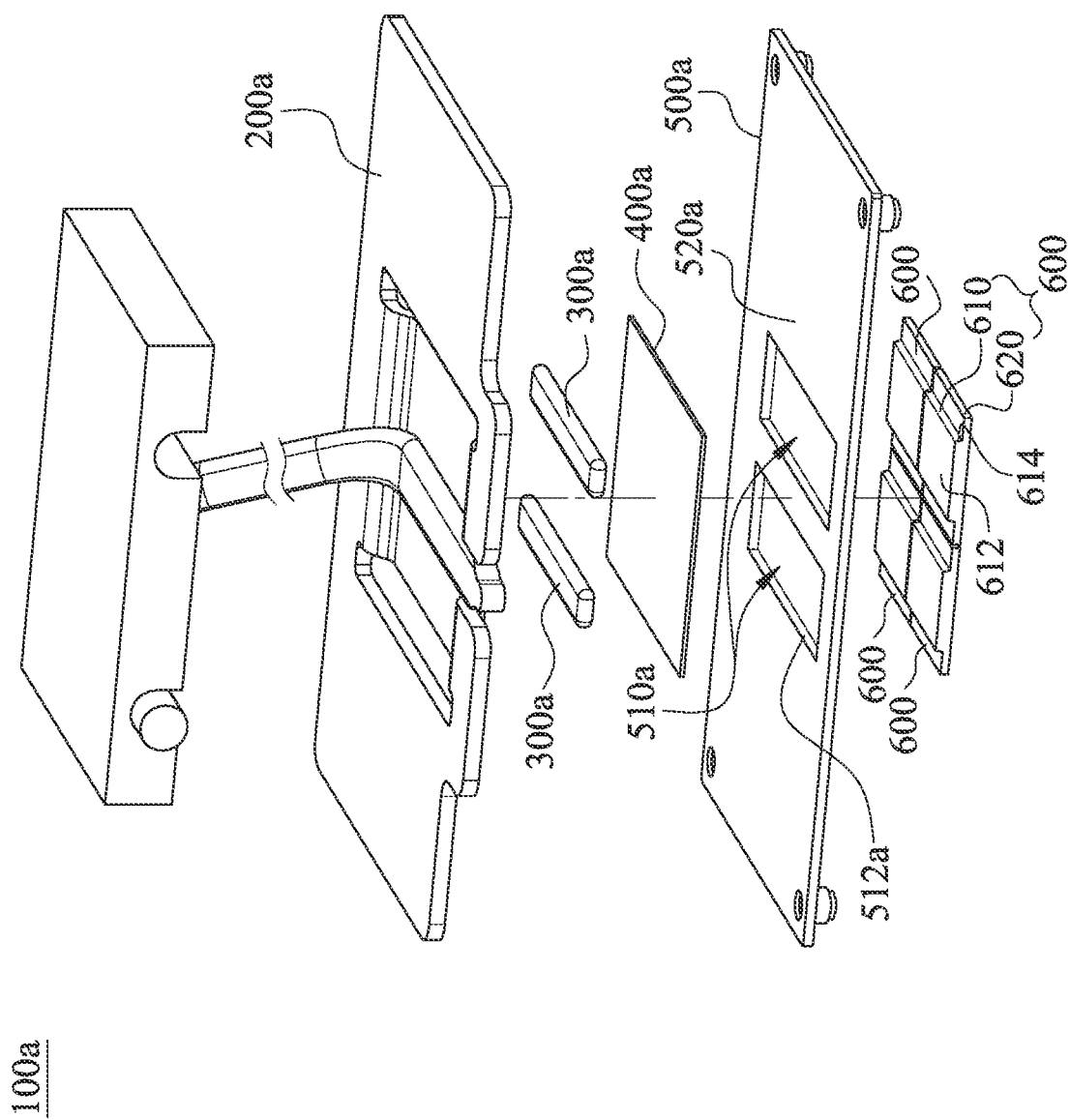
FIG. 8 shows a three-dimensional exploded view at a first viewing angle of the heat dissipation structure according to the embodiment of FIG. 7.
Figure 9:
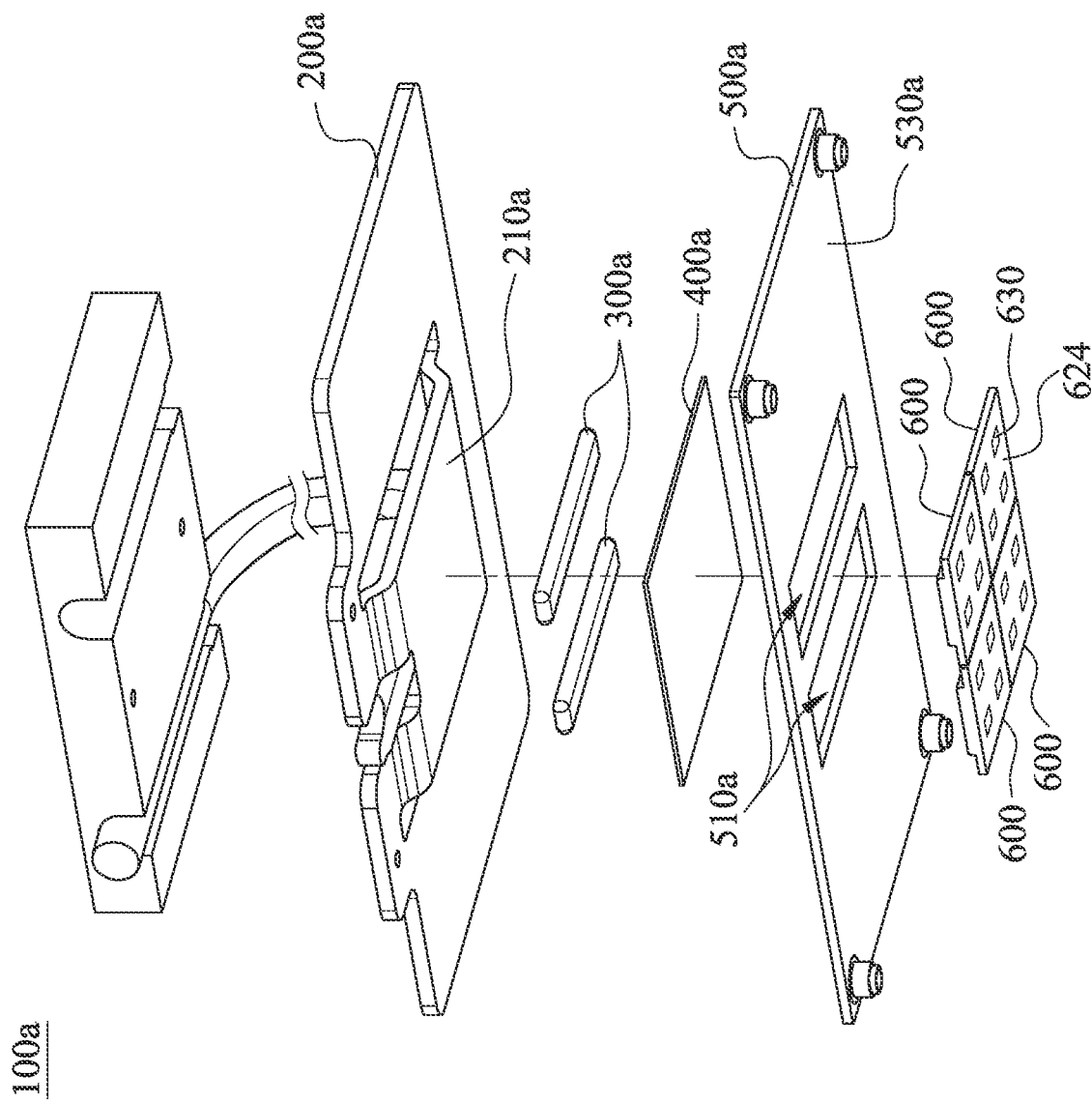
FIG. 9 shows a three-dimensional exploded view at a second viewing angle of the heat dissipation structure according to the embodiment of FIG. 7.

Please refer to FIG. 7, FIG. 8 and FIG. 9. FIG. 7 shows a three-dimensional schematic view of a heat dissipation structure 100a according to a second embodiment of the present disclosure. FIG. 8 shows a three-dimensional exploded view at a first viewing angle of the heat dissipation structure 100a according to the embodiment of FIG. 7. FIG. 9 shows a three-dimensional exploded view at a second viewing angle of the heat dissipation structure 100a according to the embodiment of FIG. 7. The heat dissipation structure 100a includes a heat sink 200a, two first thermal interface materials 300a, a second thermal interface material 400a, a circuit board 500a and a plurality of circuit elements 600.

The heat sink 200a is made of metal, and can be a heat pipe. The heat sink 200a includes a heat dissipation bottom surface 210a, and the heat dissipation bottom surface 210a is connected to the first thermal interface materials 300a.

The first thermal interface materials 300a are connected to the heat sink 200a and have fluidity. A material of each of the first thermal interface materials 300a is the same as the first thermal interface material 300 in FIG. 2, and will not be described again. The two first thermal interface materials 300a are in a strip shape before compressed, and the two first thermal interface materials 300a are pressed and bonded in a sheet shape after compressed.

The second thermal interface material 400a is connected to the first thermal interface materials 300a, and has no fluidity. A material of the second thermal interface material 400a is the same as the second thermal interface material 400 in FIG. 2, and will not be described again.

The circuit board 500a is connected to the second thermal interface material 400a, and has a plurality of openings 510a, a top board surface 520a and a bottom board surface 530a. The circuit board 500a can be a printed circuit board. A number of the openings 510a is two.

The circuit elements 600 are disposed on the circuit board 500a, and a number of the circuit elements 600 is 4. The structure of each of the circuit elements 600 is the same as the circuit element 600 in FIG. 2, and will not be described again. Furthermore, the convex portions 610 of two of the circuit elements 600 are disposed in one of the openings 510a, and the convex portions 610 of the other two of the circuit elements 600 are disposed in the other one of the openings 510a.

The heat sink 200a, the first thermal interface material 300a, the second thermal interface material 400a, the circuit board 500a and the circuit elements 600 are connected in sequence, and the second thermal interface material 400a is connected to the top board surface 520a and the top convex surface 612 of the convex portion 610 of each of the circuit elements 600. An interface material area of the second thermal interface material 400a is greater than a hole area of each of the openings 510a. In one embodiment, the interface material area of the second thermal interface material 400a is greater than a sum of the hole area of the openings 510a. The second thermal interface material 400a covers each of the openings 510a and a part of the top board surface 520a to seal each of the openings 510a.

Please refer to FIG. 7 to FIG. 12. FIG. 10 shows a partial cross-sectional view of the heat dissipation structure 100a taken along line 10-10 in FIG. 7 before the first thermal interface material 300a is deformed. FIG. 11 shows a partial cross-sectional view of a first example of the heat dissipation structure 100a taken along line 10-10 in FIG. 7 after the first thermal interface material 300a is deformed. FIG. 12 shows a partial cross-sectional view of a second example of the heat dissipation structure 100a taken along line 10-10 in FIG. 7 after the first thermal interface material 300a is deformed. As shown in FIG. 10, the two first thermal interface materials 300a are in the strip shape before compressed and deformed. In FIG. 11, the first thermal interface materials 300a are only connected between the heat sink 200a and the second thermal interface material 400a. In FIG. 12, the first thermal interface materials 300a are only connected to the heat sink 200a, the second thermal interface material 400a and the circuit board 500a. In other words, a part of the first thermal interface materials 300a may flow over the second thermal interface material 400a to the top board surface 520a which is not covered by the second thermal interface material 400a. Moreover, the heat sink 200a, the first thermal interface materials 300a, the second thermal interface material 400a, the circuit board 500a and the circuit elements 600 are connected in sequence at an area position R1 which is corresponding to a position except for the openings 510a. The heat sink 200a, the first interface material 300a, the second thermal interface material 400a and the circuit elements 600 are connected in sequence at an area position R2 corresponding to the opening 510a. Furthermore, the top convex surface 612 of the convex portion 610 of each of the circuit elements 600 is disposed in one of the openings 510a, and a convex surface area of the top convex surface 612 is smaller than a hole area of one of the opening 510a which is corresponding thereto. An edge 512a of one of the opening 510a is spaced from a side edge 614 of the convex portion 610 which is corresponding thereto by a gap G.

Thus, the heat dissipation structure 100a of the present disclosure can utilize a combination of multiple thermal interface materials, wherein the fluidity of the first thermal interface materials 300a can reduce the applying force generated by compressing the second thermal interface material 400a, to absorb assembly tolerance, and avoid too much force applying on each of the circuit elements 600 and BGA crack. Moreover, the second thermal interface material 400a has a specific shape and hardness to prevent the first thermal interface material 300a from overflowing to the circuit element 600 due to compression. The dissipation structure 100a of the present disclosure utilizes the two different thermal interface materials to achieve mutual benefit complementation, and solve the problems of the assembly tolerance, the circuit efficiency affected by the overflowing of the thermal interface material and destruction caused by the applying force in the conventional technique.

According to the aforementioned embodiments and examples, the advantages of the present disclosure are described as follows.

1. The dissipation structure of the present disclosure utilizes a combination of multiple thermal interface materials to absorb assembly tolerance, prevent the thermal interface material from overflowing to the circuit element due to compression and avoid the problems caused by the applying force.

2. The first thermal interface material with fluidity is adjacent with the heat sink and isolated from the circuit element, the second thermal interface material with no fluidity is adjacent with the heat sink and isolated from the heat sink. The dissipation structure of the present disclosure with the first thermal interface material and the second thermal interface material can achieve mutual benefit complementation, and solve the problems of the assembly tolerance, the circuit efficiency affected by the overflowing of the thermal interface material and destruction caused by the applying force in the conventional technique.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A heat dissipation structure, comprising:
   a heat sink;
   a first thermal interface material connected to the heat sink and having fluidity;
   a second thermal interface material connected to the first thermal interface material and having no fluidity;
   a circuit board connected to the second thermal interface material and having an opening, a top board surface and a bottom board surface; and
   a circuit element comprising:
      a convex portion having a top convex surface and disposed in the opening; and
      a base portion connected to the convex portion and the bottom board surface;
   wherein the heat sink, the first thermal interface material, the second thermal interface material, the circuit board and the circuit element are connected in sequence, and the second thermal interface material is connected to the top board surface and the top convex surface.

2. The heat dissipation structure of claim 1, wherein the circuit element is an antenna module, the antenna module comprises at least one antenna, the base portion has a top surface and a bottom surface, the top surface and the bottom surface are disposed on two opposite sides of the base portion, respectively, the top surface faces toward the circuit board, and the at least one antenna is disposed on the bottom surface.

3. The heat dissipation structure of claim 1, wherein the first thermal interface material has a flow rate, and the first thermal interface material is only connected between the heat sink and the second thermal interface material.

4. The heat dissipation structure of claim 1, wherein the top convex surface is disposed in the opening, and a convex surface area of the top convex surface is smaller than a hole area of the opening.

5. The heat dissipation structure of claim 4, wherein an edge of the opening is spaced from a side edge of the convex portion by a gap.

6. The heat dissipation structure of claim 1, wherein an interface material area of the second thermal interface material is greater than a hole area of the opening, and the second thermal interface material covers the opening and a part of the top board surface to seal the opening.

7. The heat dissipation structure of claim 1, wherein the heat sink, the first thermal interface material, the second thermal interface material and the circuit element are connected in sequence at an area position corresponding to the opening.

8. A heat dissipation structure, comprising:
   a heat sink;
   a first thermal interface material connected to the heat sink and having fluidity;
   a second thermal interface material connected to the first thermal interface material and having no fluidity;
   a circuit board connected to the second thermal interface material and having a plurality of openings, a top board surface and a bottom board surface; and
   a plurality of circuit elements, wherein each of the circuit elements comprises:
      a convex portion having a top convex surface and disposed in one of the openings; and
      a base portion connected to the convex portion and the bottom board surface;
   wherein the heat sink, the first thermal interface material, the second thermal interface material, the circuit board and the circuit elements are connected in sequence, and the second thermal interface material is connected to the top board surface and the top convex surface of the convex portion of each of the circuit elements.

9. The heat dissipation structure of claim 8, wherein each of the circuit elements is an antenna module, the antenna module comprises at least one antenna, the base portion has a top surface and a bottom surface, the top surface and the bottom surface are disposed on two opposite sides of the base portion respectively, the top surface faces toward the circuit board, and the at least one antenna is disposed on the bottom surface.

10. The heat dissipation structure of claim 8, wherein an interface material area of the second thermal interface material is greater than a hole area of each of the openings, and the second thermal interface material covers each of the openings and a part of the top board surface to seal each of the openings.

* * * * *